United States Patent
Chantre et al.

(10) Patent No.: US 6,436,782 B2
(45) Date of Patent: Aug. 20, 2002

(54) PROCESS FOR FABRICATING A SELF-ALIGNED DOUBLE-POLYSILICON BIPOLAR TRANSISTOR

(75) Inventors: Alain Chantre, Seyssins; Michel Marty, Varces; Hélène Baudry, Grenoble, all of (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/796,116

(22) Filed: Feb. 28, 2001

(30) Foreign Application Priority Data

Mar. 6, 2000 (FR) .............................. 00 02855

(51) Int. Cl.⁷ ............................................. H01L 21/331
(52) U.S. Cl. ........................ 438/350; 438/364; 438/366
(58) Field of Search .................... 438/350, 364, 438/366

(56) References Cited

U.S. PATENT DOCUMENTS

| | | | |
|---|---|---|---|
| 4,855,015 A | 8/1989 | Douglas ..................... 156/626 |
| 5,037,768 A | * 8/1991 | Cosentino .................. 438/364 |
| 5,227,333 A | 7/1993 | Shepard ..................... 437/189 |
| 5,340,753 A | 8/1994 | Bassous et al. ............... 437/31 |
| 5,403,757 A | * 4/1995 | Suzuki ........................ 438/364 |
| 5,462,883 A | 10/1995 | Dennard et al. .............. 437/21 |
| 5,502,330 A | * 3/1996 | Johnson et al. .............. 257/588 |
| 5,592,017 A | * 1/1997 | Johnson ....................... 257/554 |
| 5,593,905 A | * 1/1997 | Johnson et al. ............. 438/364 |
| 5,616,508 A | * 4/1997 | Johnson ....................... 438/350 |
| 5,629,556 A | * 5/1997 | Johnson ....................... 257/592 |
| 5,766,999 A | 6/1998 | Sato ............................ 438/309 |
| 5,866,462 A | * 2/1999 | Tsai et al. .................... 438/366 |

FOREIGN PATENT DOCUMENTS

| | | | | |
|---|---|---|---|---|
| EP | 0 729 177 A2 | 8/1996 | ......... H01L/21/331 |
| FR | 2 764 733 | 12/1998 | ......... H01L/21/331 |
| FR | 2 805 924 A1 | * 7/2001 | ......... H01L/21/331 |
| JP | 200068281 | * 3/2000 | ........... H01L/29/72 |
| JP | 200068282 | * 3/2000 | ........... H01L/29/72 |

* cited by examiner

Primary Examiner—Olik Chaudhuri
Assistant Examiner—David S Blum
(74) Attorney, Agent, or Firm—Lisa K. Jorgenson; Allen, Dyer, Doppelt, Milbrath & Gilchrist, P.A.

(57) ABSTRACT

The process includes successively forming, over a base region of a semiconductor substrate, a poly-Ge or poly-SiGe layer, an etch-stop layer over a selected zone of the Ge or SiGe layer, a layer of poly-Si of the same conductivity type as the base region, then an outer layer of dielectric material. Etching the layers includes stopping at the stop layer to form an emitter window preform, removing the stop film and selectively removing the Ge or SiGe layer in the emitter window preform to form an emitter window and to form an emitter made of poly-Si of conductivity type the opposite of the base region in the window.

18 Claims, 3 Drawing Sheets

PROCESS FOR FABRICATING A SELF-ALIGNED DOUBLE-POLYSILICON BIPOLAR TRANSISTOR

FIELD OF THE INVENTION

The present invention relates in general to the fabrication of double-polysilicon bipolar transistors (i.e. extrinsic base and emitter made of polycrystalline silicon (poly-Si), in contrast to the single-polysilicon bipolar transistors with only the emitter made of poly-Si). More particularly, the present invention relates to a process for fabricating a self-aligned double-polysilicon bipolar transistor having an epitaxially-grown base.

BACKGROUND OF THE INVENTION

The conventional process for fabricating a double-polysilicon bipolar transistor includes, as shown in FIG. 1a, forming, in or on a semiconductor substrate 1 having a first conductivity type (for example a substrate made of single-crystal silicon having an n-type conductivity), a region 2 having a second conductivity type the opposite of the first (for example a region made of silicon and/or SiGe alloy of p-type conductivity). Thus, a base region 2 of the second conductivity type (p) and a collector region underlying the base region 2 and of the first conductivity type (n) are formed in the substrate 1. The next step includes forming, on the base region 2, a first thick layer 3 made of poly-Si of the second conductivity type (for example, a heavily-doped $p^+$ layer), and, on this thick poly-Si layer 3, a thick layer of a dielectric material 4 such as $SiO_2$ or an $SiO_2/Si_3N_4$ bilayer.

An emitter window 5 is then formed by conventional photolithographic etching of the dielectric material layer 4 and the thick poly-Si layer 3 down to the base region 2 (FIG. 1b). As shown in FIG. 1c, after depositing a passivation layer 6 on the sidewalls of the window 5, the window 5 is filled and the dielectric material layer 4 is coated with a second poly-Si layer of the first conductivity type (for example heavily doped with $n^+$) to form, after masking and conventional etching, an emitter region 7 made of poly-Si of desired geometry and size. The rest of the first thick $p^+$-doped poly-Si layer forms the extrinsic base region of the transistor, whereas the remaining part of the thin silicon or SiGe alloy layer 2 located under the emitter region 7, forms the intrinsic base region of the bipolar transistor.

The doping of the various layers can be carried out conventionally, either in situ, i.e. during the formation of the layers, or after formation of the layers by ion implantation. Also in a conventional manner, it is possible for the various doped layers to undergo activation annealing of the dopants. Furthermore, the base region 2 may be conventionally formed from a single-crystal SiGe/Si bilayer.

The etching of the window 5 usually comprises a first conventional step of etching the layer of dielectric material 4, for example $SiO_2$, stopping on the first poly-Si layer 3, then a second step which is also conventional etching of the first thick poly-Si layer 3 stopping at the base region 2 (overetching). This overetching may, in practice, result in removing the active base region of the transistor, therefore leading to a defective device.

SUMMARY OF THE INVENTION

An object of the invention is to provide a process for fabricating a double-polysilicon bipolar transistor, while avoiding any risk of overetching the active base region of the transistor.

It has been found, according to the invention, that it is possible to avoid any risk of overetching the active base region of a double-polysilicon bipolar transistor during its fabrication using a process comprising: (a) the production of a substrate comprising a collector region of a first conductivity type and a base region of a second conductivity type the opposite of the first; (b) the formation on the base region of an interlayer made of germanium and/or SiGe alloy (preferably polycrystalline) of the second conductivity type; (c) the formation over a predetermined zone of the Ge and/or SiGe alloy interlayer of an etch-stop film; (d) the formation on the interlayer and the etch-stop film of a first thick layer made of polycrystalline silicone (poly-Si) of the second conductivity type; (e) the formation on the first poly-Si layer of an outer layer of a dielectric material; (f) the etching, through an appropriate mask, of a window preform in the layer of dielectric material and the first thick polysilicon layer, stopping on the etch-stop film, then removal in the window preform of the etch-stop film; (g) the selective removal in the window preform of the Ge and/or SiGe alloy layer in order to form an emitter window having a bottom formed by an exposed zone of the base region and of the sidewalls; (h) the formation of a passivation layer on the sidewalls of the emitter window; (i) the formation of a second polysilicon layer of the first conductivity type, so as to fill the emitter window and cover the outer dielectric material layer; and (j) the etching of the second polysilicon layer of the first conductivity type in order to form an emitter region of the desired geometry and size.

The processes of forming Ge and/or SiGe alloy layers are well known and it is possible to use, for example, conventional chemical vapor deposition (CVD) processes. Similarly, polysilicon layers may be formed by any conventional process such as CVD and plasma-enhanced chemical vapor deposition (PECVD). The formation of layers made of dielectric material, for example $SiO_2$ or $Si_3N_4$, such as the layer of step (c) and the passivation layer of the sidewalls of the emitter window, is also conventional in bipolar transistor technology.

The Ge and/or SiGe interlayer of step (d) has a thickness which usually varies from 2 to 125 nm and is preferably about 2 to 40 nm. The first polysilicon layer usually has a thickness of 50 to 250 nm, and preferably of 125 nm to 250 nm. The doping of these layers is carried out conventionally, either by in situ doping with a dopant of appropriate conductivity, or, after deposition of the layers, by conventional ion implantation of a dopant of appropriate conductivity. Conventionally, annealing steps may be carried out in order to activate the dopants.

SiGe alloys are well known. Among these alloys, mention may be made of $Si_{1-x}Ge_x$ where alloys $0<x<1$ and $Si_{1-x-y}Ge_xC_y$ where alloys $0<x\leq0.95$ and $0<y\leq0.05$. Preferably, SiGe alloys with a relatively high germanium content, usually 10 to 50% at germanium, will be used, since the SiGe alloy etching selectivity with respect to silicon and to $SiO_2$ increases with the germanium content of the alloy.

The masking and the etching of the various layers to form the emitter window preform may be done by any process, such as a isotropic etching by dry means, for example by plasma. The selective removal of the Ge or the SiGe film may be carried out conventionally via a chemical oxidant, for example with a 40 ml 70% $HNO_3$+20 ml $H_2O_2$+5 ml 0.5% HF solution or by isotropic plasma etching. This removal is controlled so as to take off that part of the poly-Ge or poly-SiGe layer which is located at the bottom of the emitter window preform and possibly so as to etch a small fraction of this layer under the first polysilicon layer.

The presence of the etch-stop film, for example made of SiO$_2$, means that the etching of the first polysilicon layer, which is usually by plasma etching, will definitely stop at the stop film. This is because the plasma etching of polysilicon is selective with respect to SiO$_2$ and an end-of-etching detection signal can be used conventionally. So, while the first polysilicon layer is being etched, the interlayer definitely cannot be etched to such an extent that this layer is pierced, with consequent etching of or damage to the base region. The etching of the stop film and consequently of a fraction of the interlayer may then be carried out without risk of damaging the surface of the base region, by using known etching techniques which are gentler and more selective.

BRIEF DESCRIPTION OF THE DRAWINGS

The rest of the description refers to the appended figures.

DETAILED DESCRIPTION OF THE PREFERRED EMBODIMENTS

Figure 1A:
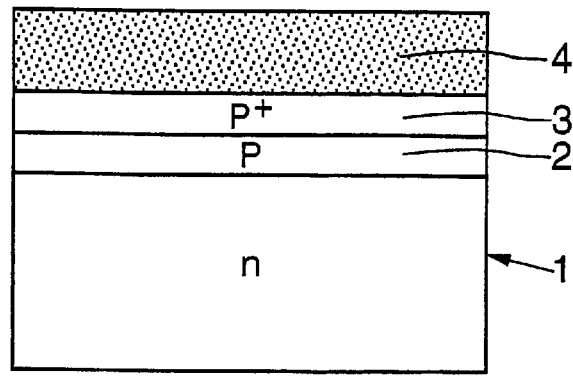
FIGS. 1a to 1c are schematic cross-sectional views of the main steps of a process for fabricating a double-polysilicon bipolar transistor, according to the prior art.
Figure 1B:
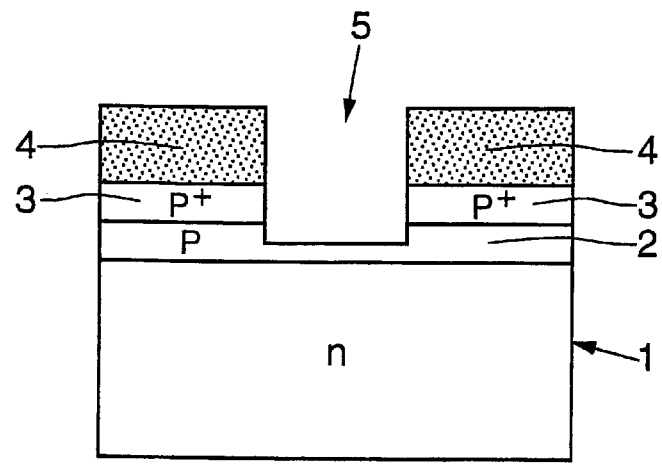
Figure 1C:
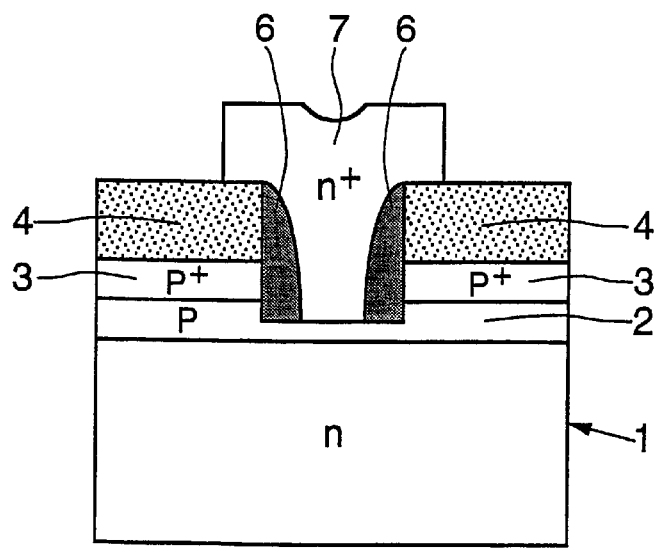

One embodiment of a double-polysilicon bipolar transistor with an npn structure, in accordance with the process of the invention, will now be described with reference to FIGS. 2a to 2e. Of course, the process may also apply to a bipolar transistor with a pnp structure.

As in the process of the prior art, the process starts by producing an n-doped silicon substrate 1 comprising a p-doped base region 2. This base region may be formed by appropriate doping of the substrate region, immediately subjacent to a main surface of the substrate 1, that part of the substrate 1 which remains n-doped then forming a collector region. This base region may also be produced by forming an appropriately doped SiGe/Si bilayer or SiGe layer on a main surface of the substrate.

A layer 3 made of Ge or p$^+$-doped SiGe alloy is then formed over the base region 2. A stop film 10, for example made of SiO$_2$ or Si$_3$N$_4$, is formed in a manner known per se over a predetermined zone of the Ge or SiGe layer 3, followed by a thick p$^+$-doped polycrystalline silicon layer, and finally an SiO$_2$ layer 5. Usually, the stop film 10 has a thickness of 10 to 50 nm. After masking (not shown), the SiO$_2$ layer 5 and the poly-Si layer 4 are etched, for example by anisotropic dry plasma etching, down to the stop film 10 in order to form an emitter window preform 6 (FIG. 2b).

Figure 2A:
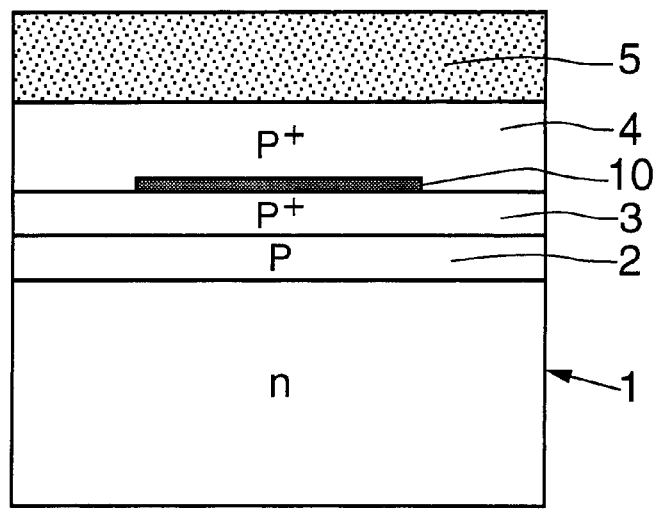
FIGS. 2a to 2e are schematic cross-sectional views of the main steps of a first embodiment of the process according to the invention.
Figure 2B:
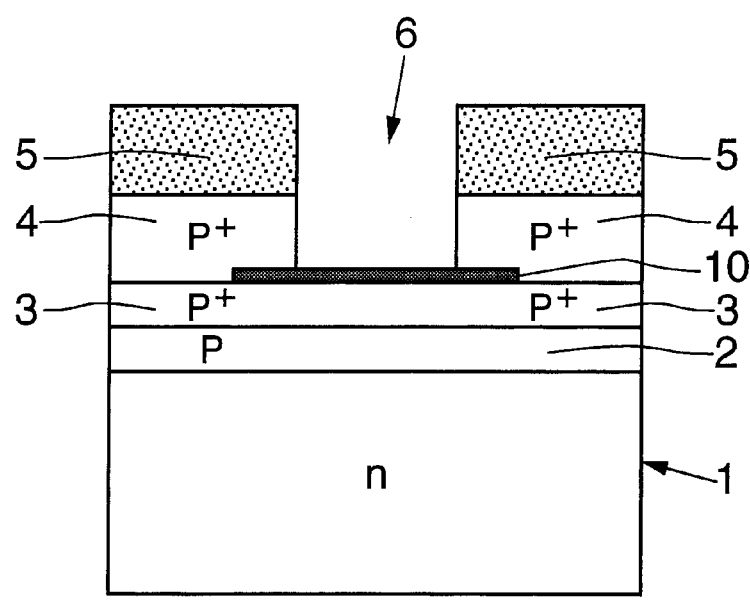
Figure 2C:
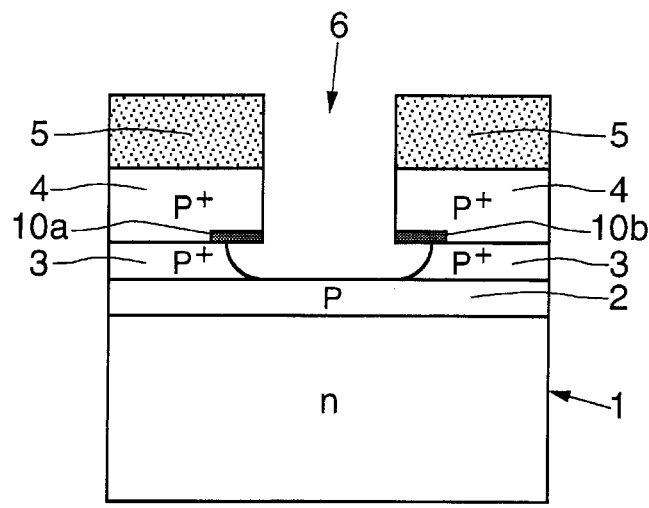

During this etching of the poly-Si layer 4, as shown in FIG. 2b, it is certain that the entire poly-Si layer 4 has been etched without any risk of the interlayer, and subsequently the base region 2, being etched. The etching of the stop film 10 and the selective etching of the Ge or SiGe layer 3 are then carried out to expose the surface of the base region 2 and thus complete the opening of the emitter window 6, as shown in FIG. 2c. This selective removal of the Ge or SiGe layer 3 usually leads to slight etching of the layer 3 under the remaining parts 10a, 10b of the stop film and the poly-Si layer 4 on each side on the sidewalls of the emitter window 6.

Figure 2D:
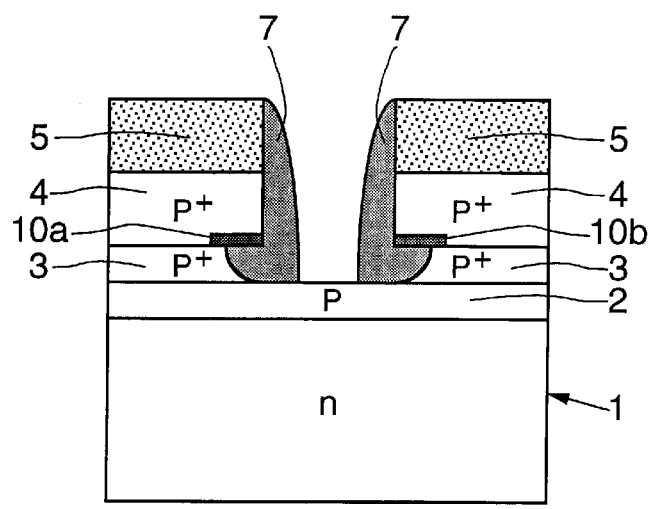
Figure 2E:
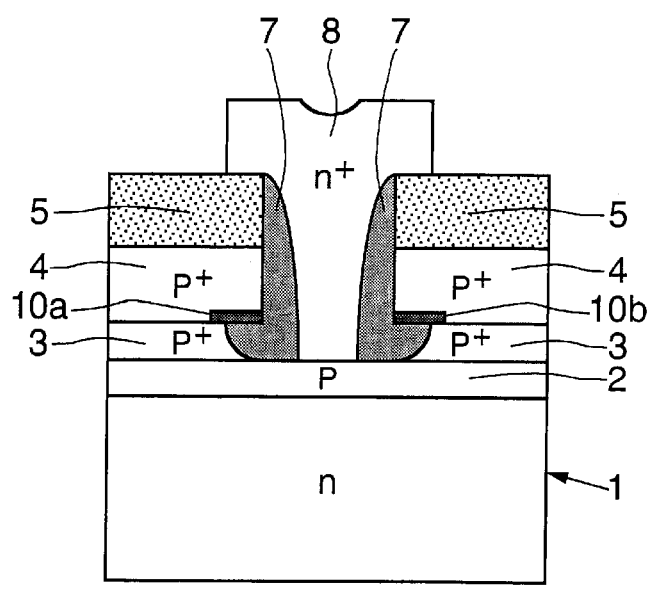

Next, the process continues conventionally with the formation on the sidewalls of the emitter window 6 of a passivation layer 7 made of dielectric material, for example SiO$_2$ or Si$_3$N$_4$, as shown in FIG. 2d. Then a second layer of n$^+$-doped poly-Si is formed by filling in the emitter window 6 and by covering the outer layer 5 of dielectric material which, after masking, is then conventionally etched to form the emitter region 8. The bipolar transistor may then be conventionally finished by forming contacts and depositing an encapsulation layer.

Thus, by the process of the invention, a self-aligned double-polysilicon bipolar transistor is formed without any risk of overetching the base region 2.

That which is claimed is:

1. A method for fabricating a self-aligned double-polysilicon bipolar transistor comprising:
   (a) producing a silicon substrate including a collector region of a first conductivity type and a base region of a second conductivity type opposite of the first conductivity type;
   (b) forming an interlayer of the second conductivity type on the base region;
   (c) forming an etch-stop layer over at least a portion of the interlayer;
   (d) forming a first polycrystalline silicon (poly-Si) layer on the interlayer and the etch-stop layer;
   (e) forming an outer dielectric layer on the first poly-Si layer;
   (f) selectively etching the outer dielectric layer and the first poly-Si layer while stopping on the etch-stop layer, and subsequently removing a corresponding part of the etch-stop layer;
   (g) selectively removing a portion of the interlayer to form an emitter window having sidewalls and a bottom defined by an exposed zone of the base region;
   (h) forming a passivation layer on the sidewalls of the emitter window;
   (i) forming a second poly-Si layer to fill the emitter window and cover the outer dielectric layer; and
   (j) selectively etching the second poly-Si layer to form an emitter region.

2. A method according to claim 1, wherein the interlayer comprises at least one of germanium (Ge) and silicon-germanium (SiGe).

3. A method according to claim 1, wherein the SiGe contains from about 10–50% germanium.

4. A method according to claim 1, wherein the first poly-Si layer comprises poly-Si of the second conductivity type, and the second poly-Si layer comprises poly-Si of the first conductivity type.

5. A method according to claim 1, wherein the etch-stop layer comprises a dielectric material.

6. A method according to claim 5, wherein the etch-stop layer comprises at least one of SiO$_2$ and Si$_3$N$_4$.

7. A method according to claim 1, wherein the etch-stop layer has a thickness of 10 to 50 nm.

8. A method according to claim 1, wherein the interlayer has a thickness in a range of about 20 to 125 nm.

9. A method according to claim 1, wherein the interlayer has a thickness of about 50 nm.

10. A method according to claim 1, wherein the first poly-Si layer has a thickness in a range of about 50 to 250 nm.

11. A method according to claim 1, wherein the first poly-Si layer has a thickness in a range of about 125 to 250 nm.

12. A method according to claim 1, wherein the outer dielectric layer comprises SiO$_2$.

13. A method according to claim 1, wherein the passivation layer comprises at least one of SiO$_2$ or Si$_3$N$_4$.

14. A method for fabricating a transistor comprising:

forming a collector region and a base region in a silicon substrate;

forming an interlayer on the base region;

forming an etch-stop layer over at least a portion of the interlayer;

forming a first poly-Si layer on the interlayer and the etch-stop layer;

forming an outer dielectric layer on the first poly-Si layer;

selectively etching the outer dielectric layer and the first poly-Si layer while stopping on the etch-stop layer, and subsequently removing a corresponding part of the etch-stop layer;

selectively removing a portion of the interlayer to form an emitter window having sidewalls and a bottom defined by an exposed area of the base region;

forming a passivation layer on the sidewalls of the emitter window;

forming a second poly-Si layer to fill the emitter window and cover the outer dielectric layer; and selectively etching the second poly-Si layer to form an emitter region.

15. A method according to claim 14, wherein the interlayer comprises at least one of germanium (Ge) and silicon-germanium (SiGe).

16. A method according to claim 14, wherein the first poly-Si layer comprises poly-Si of the second conductivity type, and the second poly-Si layer comprises poly-Si of the first conductivity type.

17. A method according to claim 14, wherein the etch-stop layer comprises at least one of $SiO_2$ and $Si_3N_4$.

18. A method according to claim 14, wherein the etch-stop layer has a thickness of 10 to 50 nm.

* * * * *